US009014228B1

(12) United States Patent
Kolis et al.

(10) Patent No.: US 9,014,228 B1
(45) Date of Patent: Apr. 21, 2015

(54) HYDROTHERMAL GROWTH OF HETEROGENEOUS SINGLE CRYSTALS FOR SOLID STATE LASER APPLICATIONS

(75) Inventors: Joseph W. Kolis, Central, SC (US); Colin D. McMillen, Liberty, SC (US); J. Matthew Mann, Anderson, SC (US); John M. Ballato, Clemson, SC (US)

(73) Assignee: Clemson University Research Foundation, Clemson, SC (US)

( * ) Notice: Subject to any disclaimer, the term of this patent is extended or adjusted under 35 U.S.C. 154(b) by 567 days.

(21) Appl. No.: 12/832,119

(22) Filed: Jul. 8, 2010

(51) Int. Cl.
*H01S 3/16* (2006.01)

(52) U.S. Cl.
CPC ................................. *H01S 3/1611* (2013.01)

(58) Field of Classification Search
CPC ..... H01S 3/1601; H01S 3/1611; H01S 3/164; H01S 3/1643; H01S 3/1671; H01S 3/1673; H01S 3/1115
USPC ............................................................ 372/41
See application file for complete search history.

(56) References Cited

U.S. PATENT DOCUMENTS

| | | | |
|---|---|---|---|
| 3,505,239 A * | 4/1970 | Mazelsky et al. ....... | 252/301.4 P |
| 4,305,778 A | 12/1981 | Gier et al. | |
| 5,066,356 A | 11/1991 | Ferretti et al. | |
| 5,119,382 A | 6/1992 | Kennedy et al. | |
| 5,394,413 A | 2/1995 | Zayhowski | |
| 5,441,803 A | 8/1995 | Meissner | |
| 5,495,494 A * | 2/1996 | Molva et al. ............. | 372/98 |
| 5,502,737 A | 3/1996 | Chartier et al. | |
| 5,563,899 A | 10/1996 | Meissner et al. | |
| 5,761,233 A | 6/1998 | Bruesselbach et al. | |
| 5,846,638 A | 12/1998 | Meissner | |
| 6,025,060 A | 2/2000 | Meissner | |
| 6,347,109 B1 | 2/2002 | Beach et al. | |
| 6,834,070 B2 | 12/2004 | Zapata | |
| 6,845,111 B2 | 1/2005 | Sumida et al. | |
| 6,944,196 B2 | 9/2005 | Wittrock | |
| 6,973,115 B1 | 12/2005 | Ferrand et al. | |
| 7,203,209 B2 * | 4/2007 | Young et al. ............ | 372/11 |
| 7,211,234 B2 | 5/2007 | Kolis et al. | |

(Continued)

FOREIGN PATENT DOCUMENTS

EP    0065382 A1    11/1982

OTHER PUBLICATIONS

Huang et al., "Nd:YVO4 single crystal fiber growth by the LHPG method", J. Crystal Growth 229 (2001), pp. 184-187.*

(Continued)

*Primary Examiner* — Xinning Niu
(74) *Attorney, Agent, or Firm* — Dority & Manning, P.A.

(57) ABSTRACT

Disclosed are heterogeneous crystals for use in a laser cavity and methods of forming the crystals. A crystal can be a monolithic crystal containing regions that are based upon the same host material but differ from one another according to some material feature such that they can perform various functions related to lasing. Disclosed methods include hydrothermal growth techniques for the growth of differing epitaxial layers on a host. A host material can be doped in one region with a suitable active lasing ion and can be formed with another region that is undoped and can act as an endcap, a waveguide cladding layer, or a substrate to provide strength and/or contact to a heat sink. Regions can be formed with controlled thickness in conjunction. Following formation, a heterogeneous crystal can be cut, polished and coated with mirror films at each end for use in a laser cavity.

27 Claims, 1 Drawing Sheet

(56) References Cited

U.S. PATENT DOCUMENTS

| | | | |
|---|---|---|---|
| 7,374,616 | B2 | 5/2008 | Kolis |
| 7,540,917 | B2 | 6/2009 | Kolis et al. |
| 7,563,320 | B2 | 7/2009 | Kolis et al. |
| 7,591,896 | B2 | 9/2009 | Kolis et al. |
| 7,731,795 | B2 | 6/2010 | Kolis et al. |
| 2005/0200235 | A1* | 9/2005 | Higuchi et al. ............ 310/313 R |
| 2005/0226303 | A1* | 10/2005 | Suzudo et al. .................. 372/75 |
| 2007/0071059 | A1 | 3/2007 | Afzal et al. |
| 2007/0098024 | A1* | 5/2007 | Mitchell .......................... 372/10 |
| 2007/0253453 | A1 | 11/2007 | Essaian et al. |
| 2009/0041067 | A1 | 2/2009 | Meissner et al. |
| 2009/0151621 | A1 | 6/2009 | Kolis et al. |
| 2010/0189619 | A1 | 7/2010 | Kolis et al. |

OTHER PUBLICATIONS

Armstrong et al., "Novel composite structure Nd:YAG gain media for high power scaling of side-pumped configurations", *Optics Communications*, (2000), 175, pp. 201-207.

Degnan, "Optimization of Passively Q-Switched Lasers" *IEEE Journal of Quantum Electroic*, 31, 11, (1995) pp. 1890-1901.

Forbes et al., "The hydrothermal syntheseis, solubility and crystal growth of $YVO_4$ and $Nd:YVO_4$", *Journal Crystal Growth*, 310 (2008), pp. 4472-4476.

Feldman et al., "Dynamics of chromium ion valence transformations in Cr, Ca:YAG crystals used as laser gain and passive Q-switching media", *Optical Materials*, (2003), 24, pp. 333-344.

B. Ferrand, et al., "Liquie phase eiptaxy: A versatile technique for the development of miniature optical components in single crystal dielectric media", *Optical Materials*. 11, (1999), pp. 101-114.

Kolb, et al., "Phase Equilibria of $Y_3Al_5O_{12}$, Hydrothermal Growth of $Gd_3Ga_5O_{12}$ and Hydrothermal Epitaxy of Magnetic Garnets" *Journal of Crystal Growth*, 29, (1975), pp. 29-39.

R.A. Laudise, J.W. Nielson, *Solid State Phys*. 12 (1961) 149-222.

McDonald et al., "Reducing thermal lensing in diode-pumped laser rods", *Optics Communications*, (2000), 178, pp. 383-393.

Mill, *Sov. Phys. Crystallogr*. 12 (1967) 195).

Okhrimchuk, et al., "Performance of YAG:$Cr^{4+}$ laser crystal" *Optical Materials*, 3, (1994) pp. 1-13.

Puttbach, et al., *J. Phys. Chem. Solids*, Suppl. 1, (1967) 569-571.

Song et al., Growth of composite sapphire/Ti:sapphire by the hydrothermal method, *J. Crystal Growth*, 277, (2005), pp. 200-204.

Zayhowski, "Microchip Lasers", *Optical Materials*, 11 (1999) pp. 255-267.

Zayhowski, "Q-switched microchip lasters find real-world application" *Laser Focus World*, Aug. 1999, pp. 129-136.

Citation of Patent Applications—Related Applications Form.

Mao et al., "High Efficient Laser Operation of the High-Doped Nd:YAG Crystal Grown by Temperature Gradient Technology", Chin.Phys.Lett. 19 (9), 2002, 1293-1295.

* cited by examiner

HYDROTHERMAL GROWTH OF HETEROGENEOUS SINGLE CRYSTALS FOR SOLID STATE LASER APPLICATIONS

STATEMENT REGARDING FEDERALLY SPONSORED RESEARCH OR DEVELOPMENT

This invention was made with government support under Grant No. FA9550-07-1-0566 awarded by the United States Air Force/Air Force Office of Scientific Research and under Grant No. DMR 0907395 awarded by the National Science Foundation. The government has certain rights in the invention.

BACKGROUND

Typically, a solid state laser cavity contains a host material that is doped with a small amount of an activator ion. This ion can be pumped by a light source such as a flash lamp or more commonly, a diode laser of suitable frequency. The light from the pump is absorbed by the gain medium, i.e., the doped host, creating a population inversion that causes stimulated emission of coherent light. The output light can be in the form of continuous or pulsed emission.

While the gain medium can be the only crystal regime of a laser cavity, solid-state lasers often employ several single crystal regimes that serve a series of purposes including thermal management, mechanical strength, waveguiding, and the like. These regimes can occur in the form of a series of layers or films that have similar lattice structures and dimensions, but with slightly different chemical compositions where the different compositions reflect the different functions.

Thermal management is a significant matter particularly with regard to high-energy solid-state lasers. For instance, thermal lensing and surface distortion become a significant matter for higher power applications during which residual heat buildup can be localized in the active lasing cavity in a non-uniform fashion. This leads to irregular thermal expansion of the lattice and reduces the quality of the beam. Such localized heating also changes the refractive index of the material leading to gradient index (GRIN) behavior, which leads to beam defocusing. In addition, heating from the pump can induce cracking or other damage to the host crystal. This is a particularly sensitive issue because the damage is often induced at small defects at the crystal surface or the near subsurface that are especially sensitive to thermal damage. Another problem is distortion or cracking of any thin coating or film, such as Reflective or Anti Reflective coating applied to the surface of the crystal due to thermal deformation. Applied coatings are typically very thin and especially sensitive to surface damage. Many of these issues have been summarized in the technical literature (for example Armstrong et al. *Optics Comm.* 2000, 175, 201; McDonald et al. *Optics Comm.* 2000, 178, 383.), as well as the patent literature (see, e.g., U.S. Pat. No. 6,845,111 to Sumida, et al., U.S. Pat. No. 6,944,196 to Wittrock, and U.S. Pat. No. 5,761,233 to Bruesselbach, et al.).

One method for solving such thermal problems is to provide a moderately thick undoped host lattice regime attached directly to the doped lasing crystal. For example undoped regions of the host crystal have been placed at either end of a bar or rod laser to serve as endcaps. In this configuration the pump light will penetrate the undoped region of the crystal for a certain distance before it begins to get absorbed by the activator ions. The relatively thick endcap can dissipate heat buildup and minimize any distortion at the crystal face.

In thin disk lasers it is often desirable to have a thin layer region doped with activator ions on a thicker undoped region that serves as a substrate. The activator region is a thin disk so as to maximize surface contact with a heat sink. The undoped part of the crystal acts as a substrate to add mechanical strength and act as an interface with a heat sink or cooling zone. It may also be desirable to add an additional undoped layer of crystal to the opposite side of the cooling layer to minimize thermal damage to the reflective coatings. Such devices have been described in e.g., U.S. Pat. No. 6,347,109 to Beach, et al. and U.S. Pat. No. 6,834,070 to Zapata.

Lasing crystals have also been utilized in the form of planar or embedded waveguides. Waveguides require two zones with similar lattices whereby an internal portion, or core, contains an index of refraction that is larger than that of an outer portion, or cladding. Thus, total internal reflectance can be achieved and essentially all light that enters will exit at another end. This condition is most commonly exploited in fiber optics but can also work for other forms of matter including single crystals. It is particularly useful in that the waveguide can be thin enough to control the number of modes and the overall beam quality with little or no loss of power. In the case of crystalline planar waveguides, a thin layer of material (5-200 micron) doped with a small concentration of laser active ions can be adjacent to a thicker layer of undoped substrate (typically 50-500 micron). A further layer of undoped substrate can then be applied upon the doped layer to create a thin layer sandwiched between the two layers of thicker undoped material. If conditions are selected to ensure that that index of refraction of the thin activator layer is larger than the undoped regions, total internal reflection can be achieved and a waveguide created. Optimally it is possible to control the thickness of the activator layer so as to control the number and quality of the modes emitted.

Thermal control, strength, thin film designs and waveguiding are only a few examples of beneficial use of multiple crystal regimes in solid-state lasers. Whatever the purpose, the interface between adjacent regimes is of importance in forming such devices as it can have a large effect on overall beam quality. Moreover, if the resultant output beam is to be frequency manipulated through a non-linear process (for example second harmonic generation or optical parametric oscillation), it is important to have interfaces between adjacent crystal regimes with controlled lattice orientations to control polarization interaction with the pump light.

There are two general techniques presently in use to form heterogenous crystal devices. One method is direct bonding of the two different premade materials. Use of glues, fluxes or other bonding materials has been examined but is usually unacceptable due to degradation of the optical beam quality. Other direct bonding methods include pressure bonding, electrical potential fusion and other techniques, but these are often expensive, unreliable or otherwise not practical for scalable production of layers between 50-1000 microns thick. Such methods have been described in, e.g., U.S. Pat. Nos. 5,441,803, 5,563,899, 5,846,638, 6,025,060 and U.S. Patent Application Publication No. 2009/0041067.

A second method has been the growth of composite layers directly on a suitable substrate. Typically this has been accomplished through epitaxial growth in which one material acts as a substrate and a second material is deposited on the surface in a stepwise controlled manner. The grown layer adopts the general structural characteristics of the substrate (such as same lattice type and similar dimensions). Generally this process requires that the two materials have a similar structure type and reasonable crystal lattice match. In the case of solid-state laser devices, the use of gas phase epitaxial methods (molecular beam epitaxy, physical vapor deposition, MOCVD etc.) has not been suitable as gas phase methods are too slow to form the desired layer thickness.

Liquid phase epitaxy (LPE) as described by B. Ferrand, et al. (see, e.g., *Opt. Mater.* 11 (1999) 101-114; U.S. Pat. No. 6,973,115; EP Patent No. EP-A-0 653-82) has also been used. LPE employs high temperature fluxes to dissolve the substrate material and deposit the appropriate layers on the substrate seed via supersaturation. It typically employs molten salts that are usually mixtures of lead oxide and boron oxide or other metal oxides that melt between 1200° C. and 1600° C. and impart modest solubility to the desired layer material. Unfortunately, the LPE method often utilizes highly toxic lead-based solvents and requires very high temperature processing, leading to increased environmental danger and costs. Additionally, the formed boules must be treated to spin away flux and cleaned with nitric acid to remove any residual flux. Furthermore, the high temperature solvents often contaminate the resultant product with the flux and/or impurities in the flux.

Hydrothermal techniques, in which a temperature differential is developed to create a supersaturated solution leading to crystal growth on a seed, have been utilized for bulk single crystal growth (see, e.g., R. A. Laudise, J. W. Nielson, *Solid State Phys.* 12 (1961) 149-222), but are not known for use in forming heterogeneous materials. For example electronic grade quartz is grown commercially by the hydrothermal method. Other crystals, such as potassium titanyl phosphate (KTP) are grown by both flux and hydrothermal methods, and it is widely acknowledged by those familiar with the art that the hydrothermally grown products are of generally superior quality.

What are needed in the art are methods for forming solid state laser devices incorporating multiple crystal regimes that are more economical than previous methods. For example, a low temperature, facile process that can provide a monolithic heterogenous crystal for use in a laser cavity with no beam degradation problems due to interface between adjacent materials would be of great benefit.

SUMMARY

According to one embodiment, disclosed is a method for forming a monolithic heterogeneous crystal. For example, a method can include heating and pressurizing an aqueous solution held within a reactor so as to develop a temperature differential between a first zone of the reactor and a second zone of the reactor. The reactor includes a feedstock in the first zone and a seed crystal in the second zone. Upon heating and pressurizing the contents of the reactor, a hydrothermal growth process can ensue during which growth of a new crystal region is initiated on the seed crystal. According to the present disclosure, the composition of the new crystal region can differ from the composition of the seed crystal such that the product formed is a heterogeneous, monolithic crystal. For instance, the new crystal region can include a dopant, such as an activator ion, and the seed crystal can be an undoped crystal. In one embodiment, the seed crystal can be a heterogeneous monolithic crystal and the product crystal can include multiple regions that differ from adjacent regions according to some aspect of their composition.

A product crystal can be cut, polished, and further processed as desired, for instance to form a smaller heterogeneous product crystal for use in a microlaser cavity.

Also disclosed are monolithic heterogeneous crystals as may be formed according to disclosed processes. For example, a monolithic heterogeneous crystal can include a first region and a second region, the first and second region including the same host material, but the composition of the first region differing from the composition of the second region. For instance, the first region can include a dopant in a concentration of greater than about 2 at. % of the host material of the first region and the second region can be undoped, can be doped with a different dopant, or can be doped with the same dopant but at a different concentration.

Disclosed methods can be utilized to form highly doped regions of a heterogeneous crystal. For instance a region can include a dopant in a concentration of between about 2 at. % and about 10 at. % of the host material of the region, between about 2 at. % and about 50 at. % of the host material of the region, or between about 10 at. % and about 50 at. % of the host material of the region.

Also disclosed are products incorporating heterogeneous monolithic crystals as may be formed according to disclosed methods. For instance, a monolithic heterogeneous crystal as disclosed herein can be incorporated into a microlaser device.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Figure 1:
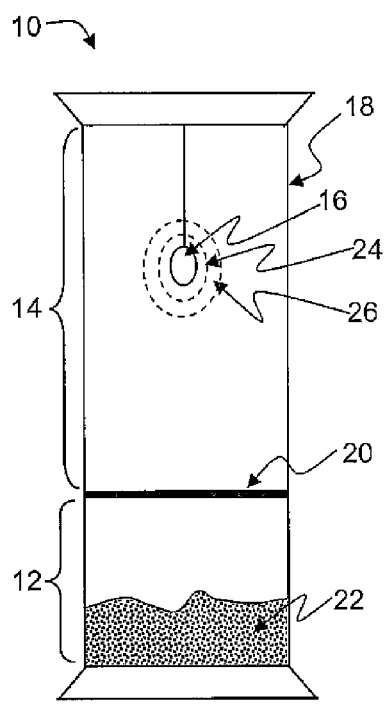
FIG. 1 is a schematic diagram of one embodiment of a hydrothermal growth system as described herein.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment, may be used in another embodiment to yield a still further embodiment.

In general, disclosed herein are heterogeneous crystals suitable for use in a laser cavity. A crystal can be a monolithic crystal containing two or more regions that are based upon the same host material but differ from one another according to some material feature such that they can perform various functions related to lasing. For instance, a first region of a monolithic crystal can be undoped and an adjacent region can be doped, or adjacent regions can include different dopants or the same dopant at different dopant concentrations.

Also disclosed are processes for manufacturing a heterogeneous crystal. In general, a method comprises a hydrothermal growth technique for the growth of differing epitaxial layers on a host, for example a $Y_3Al_5O_{12}$ (YAG) or $Lu_2O_3$ host material can be doped in one region with a suitable active lasing ion such as $Nd^{3+}$ or $Yb^{3+}$, and can be formed with another region that is undoped and can act as an endcap, a waveguide cladding layer, or a substrate to provide strength and/or contact to a heat sink. A hydrothermal growth process can be used to grow and develop an individual region of a crystal with controlled thickness in conjunction with an adjacent region formed of the same base material but having a slightly different composition with regard to, e.g., dopants. Following formation, a heterogeneous crystal can be further processed as desired. For instance, a heterogeneous crystal can be cut, polished and coated with mirror films at each end for use in a laser cavity.

The host material can be any crystalline material as is known in the art and suitable for use in a lasing methodology. One exemplary host material is $Y_3Al_5O_{12}$ (YAG), which is commonly utilized in laser technologies. Though the present discussion often refers to a YAG host material, it should be understood that the disclosure is in no way limited to YAG host materials. Methods can be extended to many other hosts as well. By way of example, hosts such as $YVO_4$ and $M_2O_3$ (where M is Sc, Y or Lu) can be utilized. Numerous other host lattices including $Lu_3Al_5O_{12}$, $Gd_3Ga_5O_{12}$, $Gd_3Sc_2Ga_3O_{12}$, other garnets, oxides, spinels, perovskites phosphates, vanadates, borates, fluorides and other halides are encompassed and host materials are only limited by their stability in hydrothermal fluids, as further described below.

A hydrothermal growth method can eliminate the use of molten flux solutions as are needed for LPE. By eliminating the fluxes from the growth process, a number of steps can be saved including the need to spin away flux and clean the boules with nitric acid to remove any residual flux. Furthermore, the high temperature solvents utilized in LPE often contaminate the resultant product with impurities in the flux or the flux themselves. A hydrothermal growth method eliminates the need for highly toxic lead-based solvents that are often the LPE solvents of choice in YAG and other refractory oxide growth methods.

FIG. 1 illustrates one embodiment of a hydrothermal system 10 as may be utilized in a process. In general, a hydrothermal process involves the use of a superheated aqueous solution (liquid heated above its boiling point) under pressure to cause transport of soluble species of a refractory oxide from a nutrient rich zone 12 to a supersaturated zone 14. As the refractory oxide is not sufficiently soluble in the superheated water, the species will crystallize, either spontaneously according to primary nucleation or alternatively on a seed crystal 16 located in the supersaturated zone 14.

A process can generally take place within a reactor 18. Depending on the chemical demands of the specific system, a reactor 18 can be lined with a noble metal such as silver, gold, platinum, palladium, etc. For instance, a liner can be a fixed liner or a floating liner. A fixed liner reactor can be in the form of a stand alone autoclave that is lined with or formed of a desired material and can carry the reactants, products, etc. When utilizing a floating liner, a smaller structure that is lined with or formed of the desired material and containing the reactants can be held or suspended within a larger autoclave. For instance, an autoclave can contain a plurality of smaller tubes, e.g., silver tubes, each of which is loaded with reactants, water, seed crystals, etc. and each of which functions as a floating liner reactor within a larger autoclave. Materials for formation of a reactor are generally known in the art and include, without limitation, metals, quartz, ceramics, Teflon®, and so forth.

A reactor 18 is generally sealable, as with a cold seal, and can be of any desirable size depending, for example, on whether a process utilizes a fixed or floating liner, the size of product crystal to be formed by the process, energy requirements (e.g., temperatures and temperature gradient during a process), and so forth. For instance, a stand alone autoclave reactor with either fixed liner or unlined can generally be between about 1 cm and about 10 cm in a cross sectional dimension and between about 10 cm and about 100 cm in height. A floating liner reactor can generally be smaller, for instance between about 0.25 cm and about 2 cm in diameter and between about 2.5 cm and about 10 cm in height. Of course, larger and smaller reactors are also encompassed herein.

A reactor 18 can include a baffle 20 between a nutrient rich zone 12 and a supersaturated zone 14. A baffle 20 can be formed of the same or different material as the wall of the reactor 18. For instance, when considering a silver lined or floating reactor 18, baffle 20 can also be silver or silver lined. Baffle 20 can define at least one hole for passage of solution from the nutrient rich zone 14 to the supersaturated zone 20. A baffle 20 can aid in maintaining a temperature differential between the two zones and can encourage substantially isothermal characteristics in each zone. Baffle 20 can also restrict convective flow between nutrient rich zone 14 and supersaturated zone 20 and can channel the convective flow across the baffle 20 into a desirable geometry.

System 10 can also include heaters, insulators, controllers, etc. as are generally known in the art (not shown on FIG. 1). For instance, a system 10 can include an air space between insulation and the reactor wall. There can also be vents at strategic places to allow air flow to be controlled. Changing vent parameters and power delivered to heaters can determine the thermodynamic condition of the autoclave. Additionally, though illustrated in a vertical arrangement with the nutrient rich zone 14 below the supersaturated zone 20, this is not a requirement of the disclosed process, and the two zones can be located in any suitable location with regard to one another, for instance in a horizontal or any other angled relationship, as long as a temperature differential between the two can encourage convective flow there between.

According to one embodiment, a seed crystal 16 can be placed in the growth zone 14 to facilitate crystallization of a dissolved feedstock 22 from a supersaturated solution. A seed crystal can be formed of a doped or undoped host material and can be a homogeneous or heterogeneous crystal.

By way of example, undoped $YVO_4$ or $M_2O_3$ (where M=Sc, Y or Lu) can be utilized as a seed crystal. A seed crystal can be a synthetic or natural material. For instance, homogeneous $YVO_4$ or $M_2O_3$ may be utilized that can be grown as bulk single crystals using a hydrothermal method and transport parameters as previously described (see, e.g., U.S. Pat. No. 7,211,234 to Kolis, et al. and U.S. Pat. No. 7,563,320 to Kolis, et al., both of which are incorporated herein by reference).

Other seed crystal can also be formed according to a hydrothermal process. For instance, the use of the hydrothermal technique to grow single crystals of YAG has been reported (Kolb, et al., *J. Cryst. Growth* 29 (1975) 29-39; Puttbach, et al., *J. Phys. Chem. Solids*, Suppl. 1, (1967) 569-571; Mill, *Sov. Phys. Crystallogr*. 12 (1967) 195). Song et al. (*J. Crystal Growth* 277 (2005) 200) describes the use of hydrothermal growth to form Ti sapphire crystals.

A seed crystal may be obtained according to any formation process as is generally known. For instance, a seed crystal can be grown from a melt according to an LPE process or according to a vapor deposition process, or alternatively cut from a larger crystal formed according to such a process. Some seed crystals such as YAG and $YVO_4$ can be produced by any of the standard growth methods known to practitioners of the art, including melt growth, flux growth, Czochralski pulling, top seeded solution growth, heat exchanger and similar methods.

A process can be carried out with a seed crystal of any suitable size, the size of which is limited generally according to the diameter of the reactor. For instance, a seed crystal can be about 1 mm in thickness, and about 1 cm in diameter, or larger, as desired.

Included in system 10 can be a feedstock 22 located in the nutrient rich zone 12 of reactor 18. An illustrative example of a process is one in which suitably doped YAG feedstock 22 can be transported in hydrothermal fluids to an undoped YAG substrate seed crystal 16 to form a layer of doped YAG 24 of appropriate thickness on the seed crystal 16.

A feedstock 22 can include the host material or sources for forming the host material in a powdered form. For instance, in forming a heterogeneous crystal including a YAG host material, a feedstock can typically include excess amounts of $Y_2O_3$ and $Al_2O_3$ or alternatively premade YAG powder. A feedstock can also include a source for the desired dopant when forming a doped regime. For example, in forming a region of a crystal for use as a gain medium, the dopant can be an appropriate activator ion source such as an $Nd^{3+}$ source. Ion sources can include oxides, halides nitrates or any other suitable salt at the desired concentration as is generally known in the art.

The concentration of a dopant in a crystal region can be controlled very precisely through the addition of appropriate starting materials as feedstock. This control provides for the control of performance characteristics and lattice size. More specifically, by use of disclosed methods, dopant concentration can be maintained at a constant level throughout growth, rather than at an ever changing concentration throughout the growth as in some flux methods. Thus, the formed crystal region can include the dopant at a constant level throughout the region, which can provide an improved lattice structure and performance.

Beneficially, through utilization of a hydrothermal growth method, higher concentrations of dopants can be incorporated in a region than is possible using conventional melt growth techniques. For instance, $Nd^{3+}$ dopant can be incorporated in a host at levels greater than about 2 atomic % (at. %), or up to about 5 at. %, or up to about 10 at. %, or between about 2 at. % and about 10 at. %, which is much higher than the 1.5 at. % doping level available when utilizing a melt formation process. Of course, lower dopant concentrations are also encompassed herein. For instance, a dopant can be provided in a host material at a concentration between about 0.1 at. % and about 10 at. %. Larger dopant ion concentrations in a region are also encompassed. For example, a region can include between about 10 at. % and about 50 at. % dopant, or about 50 at. % in YAG or $Lu_2O_3$ host, such as an erbium dopant.

In one embodiment, a dopant can be an activator ion. According to this embodiment, a YAG-based crystal can be formed including a doped or undoped substrate of YAG and an adjacent region of YAG doped with a suitable activator ion that can be pumped with a diode laser of suitable frequency and emit in a desired region. Activator ion dopants can include essentially all of the suitable trivalent laser active ions including, but not limited to, $Nd^{3+}$ and $Yb^{3+}$. These two ions emit in the 1.03-1.06 µm region, which is a suitable region for many applications.

According to one embodiment, a region of $Yb^{3+}$ doped lutetia can be grown on an undoped $Lu_2O_3$ seed crystal. A feedstock can include a mixture of $Yb_2O_3$ and $Lu_2O_3$, e.g., 10 at. % $Yb_2O_3$ and 90 at. % $Lu_2O_3$. The feedstock can be located in a reactor in conjunction with an appropriate mineralizer at appropriate thermal conditions to encourage transport and a growth reaction that can provide an epitaxial layer of 10 at. % $Yb:Lu_2O_3$ on an undoped $Lu_2O_3$ substrate. Such a product could be useful for, e.g., a thin disk high energy laser cavity.

In another embodiment, a layer of Nd doped $YVO_4$ can be grown on undoped $YVO_4$ using a seed crystal of $YVO_4$ and a feedstock of powdered $YVO_4$ intermixed with enough $Nd_2O_3$ sufficient to provide the desired atomic equivalent Nd doped $YVO_4$ on the substrate, e.g., about 3 at. %. A product crystal can include 3 at. % $Nd:YVO_4$ on $YVO_4$ substrate. This material could be useful as, e.g., a diode pumped vanadate microlaser for numerous applications.

Dopants for a region of a crystal are not limited to any particular ions described as examples herein. In general, the preferred identity of a dopant can depend upon the desired function of the region and the host material in the feedstock. For instance, in addition to $Nd^{3+}$ and $Yb^{3+}$, suitable activator ion dopants can include, without limitation, $Er^{3+}$, $Tm^{3+}$, $Ho^{3+}$, and the like. In general, all trivalent lanthanides (La to Yb, Sc and Y) and most other trivalent metal ions with gain active properties can be successfully doped into a YAG lattice using a hydrothermal growth method. Typically, all the rare earths from Ce to Yb can be incorporated into a trivalent host metal site as a dopant. Moreover, a region can include more than one dopant. For instance, a region can be formed of Yb,Er:YAG or Tm,Ho:YAG. Most dopants can be provided to the feedstock as a metal oxide, halide or nitrate.

Any element in a host lattice can be varied according to disclosed methods, as desired. For instance, elements of a host lattice can be varied to adjust the refractive index and overall lattice size. Materials can be introduced to a region using appropriate sources in the feedstock (typically the dopant oxide, but occasionally the halide or nitrate salt). Other metal ions can be introduced as required by the desired function of the formed crystal regime. In one embodiment, a dopant ion can replace an optically inactive ion with a different charge. In such an embodiment another ion may also be introduced simultaneously to balance the charge in the lattice, as is generally known in the art.

The aqueous solution used in the hydrothermal process can include a mineralizer that can facilitate dissolution and transport of the feedstock. A mineralizer can include one or more small ionic species and can be added to the hydrothermal solution. Ions include but are not limited to $OH^-$, $CO_3^{2-}$, $F^-$, $Cl^-$, $NO_3^-$ and $H^+$ in various concentrations. Control of identity and concentration of a mineralizer can facilitate both the rate and quality of crystal growth. Mineralizers and parameters for their use are well known to those practiced in the art and have been used for the growth multiple electro-optic crystals such as KTP (see, e.g., U.S. Pat. No. 4,305,778 to Gier and U.S. Pat. No. 5,066,356 to Ferretti, et al., both of which are incorporated herein by reference).

The concentration of a mineralizer used in a process can vary, as is known in the art. In general, mineralizer concentration can be greater than about 1 M, for instance mineralizer concentration can vary between about 1M and about 30M, or even higher in some embodiments. In the case of a YAG base material, carbonate mineralizer can be used, for instance in a concentration between about 3M and about 8M. A process including a feedstock mixture of $Yb_2O_3$ and $Lu_2O_3$ can utilize a hydroxide mineralizer, for instance in a concentration between about 10M and about 30M. In another example, Nd doped $YVO_4$ can be grown employing a hydroxide mineralizer at a concentration of between about 1M and about 2M.

During a process, a superheated hydrothermal fluid can be contained in a reactor under pressure, typically between about 5 kpsi and about 30 kpsi. Growth and supersaturation control is achieved in a process by the use of a differential temperature gradient across a reactor. Referring again to FIG. 1, a nutrient rich zone 12 can be heated and feedstock 22 will dissolve in the hot hydrothermal fluid. The solution in the nutrient rich zone 12 becomes a saturated solution. The supersaturated zone 14 can be held at a slightly lower temperature. Consequently, the solution in the nutrient rich zone 12 can convect upward through the baffle 20 and into the supersaturated zone 14 where it will cool and become supersaturated. The dissolved feedstock can begin to come out of solution and build upon the crystal structure of the seed crystal 16. The process will continue until stopped or the feedstock supply is consumed.

Among the advantages of a hydrothermal crystal growth process are the relatively low operating temperatures. For instance, a growth process can generally be carried out at with upper temperatures of between about 500° C. and about 650° C., or between about 450° C. and about 650° C., which can be 800° C. to 1200° C. lower than an LPE method. This can simplify operating conditions and drastically minimize the amount of thermal strain regions of a forming crystal. The thermal gradient between the two zones of a reactor can likewise vary according to specific materials and growth rates desired, but typically can be between about 20° C. and about 100° C.

In general, growth rate of a developing region can be between about 1 and about 5 microns per hour, or between about 30 and about 150 microns per day. The identity and concentration of a dopant typically has little effect on the rate of layer growth. Rather, the rate of crystal growth can be controlled by the identity and concentration of a mineralizer as well as the temperature gradient across the reactor and the nature of the host material. The relatively slow growth rates possible can be beneficial as this can allow for precise control of the thickness of the forming crystal. For example, a process can reliably grow a region at about 2 microns/hour or about 25 microns/day and can thus be used to grow a region of about 100 microns over four days. Generally, growth rate can vary between about 1 and about 5 microns/hour, with preferred growth conditions for any specific system specific to the particular host lattice. Thus for example, when considering $M_2O_3$ oxide host material, a concentrated hydroxide (about 10M to about 30M) mineralizer can be used and the thermal conditions can be at the high end of the range (lower and upper zones at, e.g., about 600° C. and about 650° C., respectively). In the case of $YVO_4$ a lower concentration (e.g., about 0.1 M to about 2M) hydroxide mineralizer can be used at a somewhat lower temperatures (e.g., lower and upper zones at about 400° C. and about 480° C.).

In one embodiment, a feedstock mixture of 10 at. % $Yb_2O_3$ and 90 at. % $Lu_2O_3$ using between about 10M and about 30M hydroxide mineralizer with a temperature differential of about 100° C. between the two zones (about 600° C. and about 700° C. in the two zones) can grow 10 at. % $Yb:Lu_2O_3$ on undoped $Lu_2O_3$ substrate at a rate of between about 35 and about 57 microns/hour. In another embodiment, Nd doped $YVO_4$ can be grown on undoped $YVO_4$ using a substrate of $YVO_4$ and a feedstock of powdered $YVO_4$ intermixed with enough $Nd_2O_3$ sufficient to provide about 3% atomic equivalent Nd doped $YVO_4$. This process can employ between about 1M and about 2M hydroxide as a mineralizer and a thermal differential between the two zones of about 100° C. (about 450° C. and about 550° C., respectively). A growth rate of 5-8 microns/hour can grow layers of 3 at. % $Nd:YVO_4$ on the $YVO_4$ substrate.

Disclosed methods can be readily scaled to large numbers of samples simultaneously so time is not a hindering factor. Moreover, once a process is started it can require no operator input over the course of the reaction and can be replicated reliably many times. As such, the total time of growth can be of little consequence in the overall production process.

A process can be a simple single step process and can deposit regions of various shapes such as rods or disks. Typically formed regions can be several hundred microns to several millimeters thick, though larger or smaller materials can be formed.

A region may be grown on oriented seed faces so that the resultant coherent light emission may be polarized for further manipulation. Alternatively, growth of an epitaxial region can be carried out on a non-oriented substrate crystal. For example, a [100] oriented epitaxial region of doped material can be grown on [100] oriented crystal to provide a device with controlled polarization of the output beam.

Any number of desired layers can be grown successively on previous layers. For instance, and with reference to FIG. 1, a first layer 24 of a doped host material can be grown on a seed crystal 16 of an undoped host material and a second layer 26 of undoped host material can be formed on the first layer 24 of doped host material. In general the dopant ions do not change the crystal lattice dimensions enough to cause strain or significant defect formation to prevent high quality growth of the successive layers.

A series of multiply doped composite crystal regions can be prepared with numerous layers each differing from one another with regard to presence or absence of doping ion, type or concentration of doping ion, combination of dopants, etc., to perform a specific function. For example, a single YAG heterogeneous crystal can be prepared that contains adjacent regions doped with $Ho^{3+}$, $Tm^{3+}$, and no dopant, successively.

Additional regions can be grown on a crystal using a feedstock comprised of the desired reactants. In one embodiment, additional layers can be grown in a separate reactor following formation of a previous layer to prevent any contamination from the dopant in adjacent layers, though this is not a requirement of disclosed processes. Thus, in this embodiment, the seed crystal of the additional process can be a heterogeneous, monolithic crystal formed in a previous process.

Figure 2:
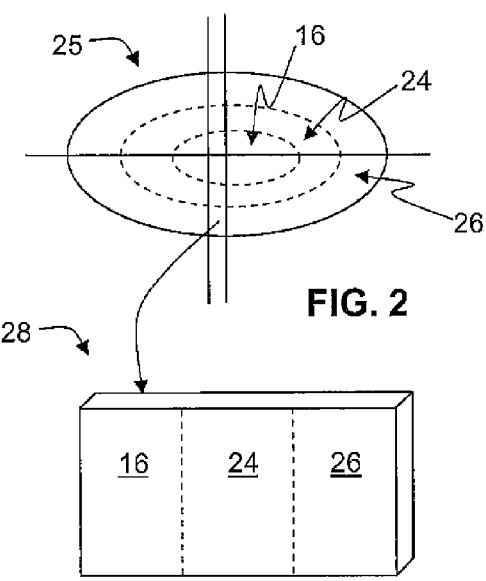
FIG. 2 is a schematic diagram of one embodiment of a method for forming a cut heterogeneous single crystal as described herein.

FIG. 2 illustrates one embodiment of a heterogeneous as-formed crystal 25 including three adjacent regions 16, 24, 26 that are based upon the same host material, but vary from the immediately adjacent region with regard to some component. A resultant product crystal 25 can be a large area substrate that can be polished and processed using techniques well known to those in the art. For example, a crystal 25 can be cut as shown by the dashed lines to form a final product crystal 28 for use in a laser cavity. In one embodiment, crystal 28 can be polished and coated with appropriate reflective coatings and cut into many pieces to form a large number of microlaser cavity devices.

Figure 3:
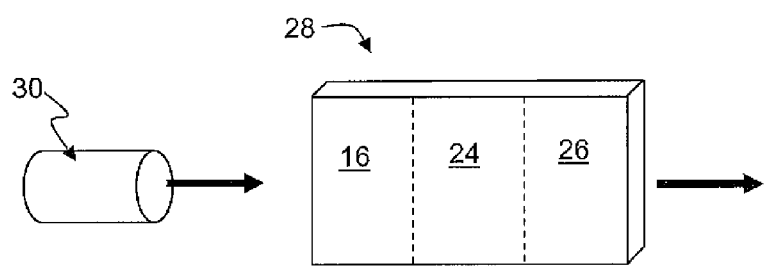
FIG. 3 is one embodiment of a laser system incorporating a heterogenous monolithic crystal as described herein.

As illustrated in FIG. 3, during use, a light source such as a flash lamp or diode laser can pump light into crystal 28, including, e.g., undoped end caps 16, 26, and gain medium 24. Activated ions within the gain medium can absorb the pumped light and create a population inversion that causes stimulated emission of coherent light.

One advantage of disclosed methods is that they can be simply and economically scaled to large volume production. A hydrothermal epitaxial growth method can be utilized to grow crystal regions on very large area substrates limited only by the inner diameter of the reactor. For instance, an original seed crystal with 25×25 millimeter dimension (or 625 mm² surface area) can produce in excess of 400 microlaser chips with 2×2 millimeter dimensions (allowing for edge defects and kerf loss) after only a few days of hydrothermal layer growth. Since the volume of each particular run is limited only by the dimensions of the seed and the inner diameter of the reactor, the ability to scale production to large volumes of devices is readily apparent. A hydrothermal process provides very uniform, homogeneous and monolithic layer growth for each region because it grown out of highly mobile and homogenous soluble growth solution, and can be used to reliable develop larger heterogeneous monolithic crystals.

Formed monolithic, heterogeneous crystals can be utilized in any suitable lasing methodology. For instance, a layer of between about 100 and about 200 micron of $Yb^{3+}$ doped YAG can be grown on a 1000 micron thick undoped YAG substrate to act as the activator region for a thin disk high energy laser. Another layer of undoped YAG can be grown on the activator-doped layer to act as an endcap to stabilize the dielectric reflectance coatings. This collectively acts as a monolithic single crystal with multifunctional parts that can be utilized as, e.g., the resonant cavity of a cryocooled high-energy thin disk laser.

In another example, an oriented layer of lasing material can be grown. For instance, an oriented layer such as the [100] layer of YAG can be grown on an oriented [100] YAG seed crystal using the hydrothermal epitaxial growth method described herein. This oriented homogeneous layered crystal can be prepared by conventional crystal growth techniques or is readily available on the commercial markets. The crystal can be cut and polished to a [100] orientation and hung as a seed in a hydrothermal autoclave as described herein. A feedstock of YAG or $Y_2O_3$ and $Al_2O_3$ doped with suitable concentration of activator ion (typically but not limited to $Nd^{3+}$ or $Yb^{3+}$) can be placed in the autoclave along with an aqueous phase containing an appropriate concentration of a suitable mineralizer, including but not limited to $OH^-$, $CO_3^{2-}$, $F^-$, $Cl^-NO_3^-$ or various combinations thereof. The autoclave can be sealed and a suitable temperature gradient can be established (typically about 580° C. in the nutrient rich zone and about 620° C. in the supersaturated zone). The temperature gradient can be maintained for an appropriate length of time to deposit an epitaxial layer of YAG that is doped with the selected amount of lasing dopant on the layered seed. The new material can grow as epitaxial layers on the substrate and is essentially a continuous part of the same crystal lattice as the substrate, distinguishable only by the dopant, $Nd^{3+}$ or $Yb^{3+}$ in the activator regime. Thus the epitaxial layers will adopt the same orientation as the substrate (for example [100]) allowing for control of polarization of the resultant beam. The product can be suitably cut, polished and coated with appropriate multi-dielectric films to create a single crystal that can serve as a laser cavity that can be oriented to align a crystallographic axis with a polarized pump beam. This can form an efficient absorber suitable for subsequent non-linear applications for example.

In another embodiment, the hydrothermal epitaxial growth technique can be used to prepare a crystal specifically designed for high-energy applications and in particular use of cryocooling to maximize heat removal and cavity stabilization. The hydrothermal epitaxial growth method described here can allow for simple growth of an undoped layer of host material. Thus an undoped single crystal of YAG of between about 1 and about 2 cm in diameter and typically about 2 mm in thickness can be used as a seed crystal. The seed crystal can be placed in an autoclave with a feedstock of $Y_2O_3$ and $Al_2O_3$ or YAG powder, along with a suitable concentration of a desired feedstock, for example but not limited to 10 at. % $Yb_2O_3$. The autoclave can be charged with an appropriate mineralizer (typically about 3M to about 8M carbonate) as described above and a thermal gradient can be established.

Over several days a layer of between about 100 and about 200 microns of 10 at. % Yb doped YAG can be grown on the undoped YAG substrate. This layer can either be randomly oriented or oriented by growth on an oriented [100] seed crystal. The crystal can be removed from the autoclave and both large faces polished, and the seed crystal can be cut down its length to form two crystals each with a 1 mm undoped substrate and a 100-200 micron thick layer doped with Yb activator ions in 10 at. % concentration. This can be used as an activator ion in the laser cavity of a high power thin disk laser using methods known to those in the art. Alternatively, this formed crystal can then be placed in another autoclave containing only pure undoped YAG feedstock and a suitable mineralizer. The second autoclave can be sealed and heated with a suitable temperature gradient. The undoped YAG is transported to single crystal to form a new single crystal layer of the desired thickness. This new layer can serve as an endcap for a solid-state, high-energy thin disk laser crystal.

In another embodiment, an undoped YAG crystal of about 10 mm by about 10 mm by about 1 mm can serve as a substrate and a layer of material that is doped with an activator ion can be grown on the substrate using the hydrothermal epitaxial method described herein. The layer can be relatively thin (about 5 to about 100 microns) with the thickness controlled using mineralizer concentrations and thermal gradients. The layer can also contain a suitable amount of gallium ions substituting for aluminum ions (typically between about 4 at. % and about 12 at. %) as well as some Lu ions substituting for Y ions (typically between about 3 and about 8 at. %). These ions can be introduced as part of the feedstock in the form of oxides $Ga_2O_3$ and $Lu_2O_3$ or as other simple feedstock sources such as simple salts, halides nitrates, hydroxides or the like. The epitaxial growth can be carried out according to a process as disclosed herein. This outer layer can be polished at the surface after growth and then be placed in an autoclave and a layer of about 1 mm undoped material can be grown at this surface as disclosed herein. The resultant product can be side pumped with a suitable pump source to create a planar waveguide laser source.

In yet another embodiment, a substrate of YAG ($Y_3Al_5O_{12}$), can have an epitaxial layer grown on it formed of YAG with $Nd^{3+}$ or $Yb^{3+}$ ions doped into the lattice to act as lasing activator ions. To achieve a sufficient difference in refractive index some of the aluminum ions of the host can be substituted with some quantity of gallium ions (about 4 at. to about 12 at. %). These ions can adopt the same lattice type but can increase the index of refraction of the thin film so that total internal reflectance is achieved. In some cases the substitution of the larger gallium ions for the smaller aluminum ions can increase the lattice size, which can lead to lattice strain that can in turn introduce defects and decrease performance. Accordingly, a small amount of smaller, optically inert lutetium ions ($Lu^{3+}$) can also be introduced to replace some of the larger $Y^{3+}$ lattice ions to reduce the overall lattice constants and achieve good epitaxial lattice match of the layers. Following, another thick layer of undoped YAG substrate can be formed upon the doped layer to create a planar waveguide. This can be end pumped or side pumped with an appropriate pump source such as a diode laser or flashlamp to create a planar waveguide laser.

The present disclosure may be better understood with reference to the following prophetic examples.

Prophetic Example 1

A single crystal boule of $Lu_2O_3$ about 2 mm to about 4 mm thick and about 1 square centimeter in size can be formed using hydrothermal bulk crystal growth techniques (see: U.S. Pat. No. 7,563,320, previously incorporated herein by reference) or obtained by any other suitable method. This piece is used as the seed crystal or substrate for the deposition of the hydrothermally grown layer of Yb:Lu$_2$O$_3$. The substrate is suspended on a ladder or frame near the top of an autoclave lined with an inert noble metal (gold, silver or platinum). The feedstock material is placed in the bottom of the autoclave and can include of some combination of Yb:Lu$_2$O$_3$, Yb$_2$O$_3$, Lu$_2$O$_3$, YbO(OH), LuO(OH), Yb(OH)$_3$ or Lu(OH)$_3$ in the desired ratio. KOH and deionized water is also added to the autoclave to produce an aqueous hydroxide mineralizer solution typically in about 10M to about 30M concentration. The autoclave is then sealed and heated using independent band heaters to control the temperatures of the nutrient rich zone (containing the feedstock) and the supersaturated zone (containing the seed crystals) and establish a solubility difference between the two zones. For growth of a Yb:Lu$_2$O$_3$ crystalline layer on a Lu$_2$O$_3$ substrate, the nutrient rich zone is typically heated to about 650° C. and the growth zone temperature is held at about 630° C. (though the process is not limited specifically to these temperatures and this temperature gradient). Using this configuration, the Yb:Lu$_2$O$_3$ layer will be deposited onto the substrate at an approximate rate of 100 microns per day. This temperature configuration is maintained for about 2 to 7 days, depending on the desired thickness of the layer. After this growth period the autoclave is cooled to room temperature and the monolithic crystal is harvested. The outer surfaces of the crystal should be polished to remove any extraneous material (typically only a few microns thick) that was deposited during the cool-down process.

The resulting crystal can be cut lengthwise along the center of the edge of the crystal to produce two separate crystals that is each a monolithic laser crystal comprised of an undoped Lu$_2$O$_3$ substrate coated with an epitaxial layer of Yb:Lu$_2$O$_3$. This crystal can then be fabricated and polished to meet the specifications of the laser device.

Prior to cutting, another layer of undoped Lu$_2$O$_3$ can be grown on top of the Yb:Lu$_2$O$_3$ layer in the same fashion described above to serve as an endcap. This is done in a separate autoclave using a feedstock comprised purely of Lu$_2$O$_3$, LuO(OH) or Lu(OH)$_3$ to prevent any contamination from the dopant in this outermost layer.

While certain embodiments of the disclosed subject matter have been described using specific terms, such description is for illustrative purposes only, and it is to be understood that changes and variations may be made without departing from the spirit or scope of the subject matter.

What is claimed is:

1. A monolithic heterogeneous crystal comprising a first region, a second region, and a third region, the monolithic heterogeneous crystal being a large area substrate single crystal, the first, second, and third regions of the monolithic crystal including the same host material, the composition of the first region differing from the composition of the second region and the third region, the first region comprising a dopant in a concentration of greater than about 0.1 at. % of the host material of the first region, the monolithic heterogeneous crystal being formed according to a hydrothermal growth process that includes heating and pressurizing an aqueous solution held within a reactor to develop a temperature differential between a first zone of the reactor and a second zone of the reactor, the reactor containing a feedstock for the host material and a source for the dopant in the first zone and a seed crystal comprising the second region including the host material in the second zone, the second region of the seed crystal comprising a crystal lattice orientation, the aqueous solution comprising a mineralizer, the heating and pressurizing initiating growth of the first region onto the second region, the first region adopting the same crystal lattice orientation as that of the second region as the first region grows on the second region, wherein following the growth of the first region onto the second region, the first and second regions are distinguishable from one another only by the presence of the dopant in the first region with the first and second regions having the same crystal lattice orientation.

2. The monolithic heterogeneous crystal of claim 1, the first region comprising the dopant in a concentration of between about 0.1 at. % and about 10 at. % of the host material of the first region.

3. The monolithic heterogeneous crystal of claim 1, the first region comprising the dopant in a concentration of between about 2 at. % and about 50 at. % of the host material of the first region.

4. The monolithic heterogeneous crystal of claim 1, the first region comprising the dopant in a concentration of between about 10 at. % and about 50 at. % of the host material of the first region.

5. The monolithic heterogeneous crystal of claim 1, wherein the second and third region comprises undoped host material the first region being located between the second region and the third region, the method further comprising heating and pressurizing another aqueous solution comprising a mineralizer within a second reactor to develop a temperature differential between a first zone of the second reactor and a second zone of the second reactor, the second reactor containing an undoped host-forming feedstock in the first zone and a monolithic heterogeneous crystal including the first and second regions in the second zone, the heating and pressurizing initiating growth of the third region from the undoped host-forming feedstock onto the first region of the monolithic crystal that includes the first and second regions, wherein following growth of the third region, the first and third regions are distinguishable from one another only by the presence of the dopant in the first region, with the third region having the same crystal orientation as the first region and the second region.

6. The monolithic heterogeneous crystal of claim 1, wherein the host material is a garnet, a vanadate, or M$_2$O$_3$, wherein M is Sc, Y, or Lu.

7. The monolithic heterogeneous crystal of claim 1, wherein the dopant in the first region is an activator ion.

8. The monolithic heterogeneous crystal of claim 7, wherein the activator ion is Nd$^{3+}$, Er$^{3+}$ Tm$^{3+}$, Ho$^{3+}$ or Yb$^{3+}$.

9. The monolithic heterogeneous crystal of claim 1, the first region further comprising a second dopant.

10. The monolithic heterogeneous crystal of claim 1, the first region further comprising an additional ion to balance the lattice charge of the first region.

11. A microlaser device comprising the monolithic heterogeneous crystal of claim 1.

12. The monolithic heterogeneous crystal of claim 1, further comprising a fourth region, the fourth region including the same host material as the first, second, and third regions, the fourth region comprising a dopant, the fourth region being formed according to a hydrothermal growth method.

13. The monolithic heterogeneous crystal of claim 12, wherein the dopant of the first region is a first activator ion and the dopant of the fourth region is a second activator ion.

14. The monolithic heterogeneous crystal of claim 7, the first region comprising a second dopant, wherein the second dopant is a second activator ion.

15. A monolithic heterogeneous crystal comprising a first region and a second region, the monolithic heterogeneous crystal being a large area substrate single crystal, the first and second regions of the monolithic crystal including the same host material, the composition of the first region differing from the composition of the second region, the first region comprising a dopant in a concentration of greater than about 0.1 at. % of the host material of the first region, the monolithic heterogeneous crystal being formed according to a hydrothermal growth process that includes heating and pressurizing an aqueous solution held within a reactor to develop a temperature differential between a first zone of the reactor and a second zone of the reactor, the reactor containing a feedstock for the host material and a source for the dopant in the first zone and a seed crystal comprising the second region including the host material in the second zone, the second region of the seed crystal comprising a crystal lattice orientation, the aqueous solution comprising a mineralizer, the heating and pressurizing initiating growth of the first region onto the second region, the first region adopting the same crystal lattice orientation as that of the second region as the first region grows onto the second region, wherein following the growth of the first region onto the second region, the first and second regions are distinguishable from one another only by the presence of the dopant in the first region with the first and second regions having the same crystal lattice orientation.

16. The monolithic heterogeneous crystal of claim 15, the first region comprising the dopant in a concentration of between about 0.1 at. % and about 10 at. % of the host material of the first region.

17. The monolithic heterogeneous crystal of claim 15, the first region comprising the dopant in a concentration of between about 2 at. % and about 50 at. % of the host material of the first region.

18. The monolithic heterogeneous crystal of claim 15, the first region comprising the dopant in a concentration of between about 10 at. % and about 50 at. % of the host material of the first region.

19. The monolithic heterogeneous crystal of claim 15, wherein the host material is a garnet, a vanadate, or $M_2O_3$, wherein M is Sc, Y, or Lu.

20. The monolithic heterogeneous crystal of claim 15, wherein the dopant in the first region is an activator ion.

21. The monolithic heterogeneous crystal of claim 20, wherein the activator ion is $Nd^{3+}$, $Er^{3+}$ $Tm^{3+}$, $Ho^{3+}$ or $Yb^{3+}$.

22. The monolithic heterogeneous crystal of claim 15, the first region further comprising a second dopant.

23. The monolithic heterogeneous crystal of claim 22, the dopant in the first region being an activator ion, wherein the second dopant is a second activator ion.

24. The monolithic heterogeneous crystal of claim 15, the first region further comprising an additional ion to balance the lattice charge of the first region.

25. A microlaser device comprising the monolithic heterogeneous crystal of claim 15.

26. The monolithic heterogeneous crystal of claim 1, wherein the seed crystal has a [100] crystal lattice orientation.

27. The monolithic heterogeneous crystal of claim 15, wherein the seed crystal has a [100] crystal lattice orientation.

* * * * *